March 16, 1971 B. E. BARNES 3,570,115

METHOD FOR MOUNTING ELECTRONIC CHIPS

Filed May 6, 1968

INVENTOR.
BRYCE E. BARNES

BY Albin Medved

ATTORNEY

United States Patent Office 3,570,115
Patented Mar. 16, 1971

3,570,115

METHOD FOR MOUNTING ELECTRONIC CHIPS

Bryce E. Barnes, Minneapolis, Minn., assignor to Honeywell Inc., Minneapolis, Minn.

Filed May 6, 1968, Ser. No. 726,818
Int. Cl. B01j *17/00;* H01l *5/00, 7/10, 7/12, 7/48, 7/54*
U.S. Cl. 29—578 7 Claims

ABSTRACT OF THE DISCLOSURE

A method for mounting an electronic chip within a circuit board, permitting the use of deposited interconnections. The circuit board is inverted against a Teflon coated sheet, the chip to be mounted is positioned through a hole in the board against the Teflon coated sheet, and epoxy is added from the rear of the hole to fill the interstice between the chip and the perimeter of the hole. After the resin has cured, the Teflon coated sheet is removed and interconnection conductors may be deposited across the resin.

BACKGROUND OF THE INVENTION

The present invention relates to the field of electronic integrated circuitry. More particularly, the present invention pertains to a method of mounting integrated circuit chips in a printed circuit board or the like and a product thus manufactured.

The prior art includes several methods of mounting electronic chips in a substrate. An early method of mounting utilized bonded wires to interconnect the chip with heavier lead wires attached to the package. Later, the bonded wires were eliminated by extending the package leads directly into the integrated circuit pads where the bonded wires had previously been connected. A more recent development is the "flip-chip" method of assembly. The flip-chip method requires that there be a protrusion above the surface of the integrated circuit. The integrated circuit is inverted to bring the protrusions into contact with metallized areas of the printed circuit board. The protrusions are then bonded to the metallized areas.

SUMMARY OF THE INVENTION

The present invention allows the use of deposited interconnection means between the integrated circuit chip and the substrate or circuit board to which it is to be mounted. It further allows the integrated circuit chip to be mounted within the circuit board, thus eliminating wasted space. The present method is easy to implement, and it provides very accurate alignment of the chip with the circuit board to allow reliable, deposited interconnections to be made. The integrated circuit chip is mounted in a hole through the board with epoxy or, in an alternative embodiment, the board can be molded around the chips as they are held against a surface of the mold.

It is therefore an object of the present invention to provide an improved method for mounting an electronic circuit chip in a circuit board to allow the use of deposited interconnection means.

It is a further object of the present invention to provide an inexpensive and easily-implemented process for connecting electronic chips to circuit boards.

It is a further object of the present invention to provide a method for mounting a chip which results in an assembly with good mechanical rigidity in a minimum space.

DESCRIPTION OF THE PREFERRED EMBODIMENT

Figure 1:
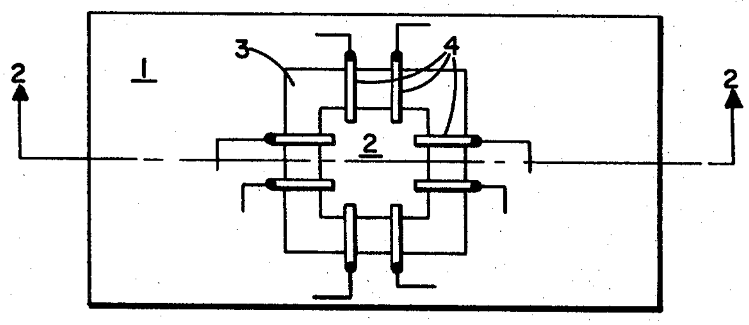
FIG. 1 is a top view of an integrated circuit chip mounted in a circuit board using the method of the present invention.

Referring to FIG. 1, an integrated circuit chip 2 is shown in a perforation in a circuit board 1, held in place by epoxy resin 3. Conducting paths 4, which may be formed by depositing methods are shown bridging resin 3 between chip 2 and the conductive paths on circuit board 1.

Figure 2:
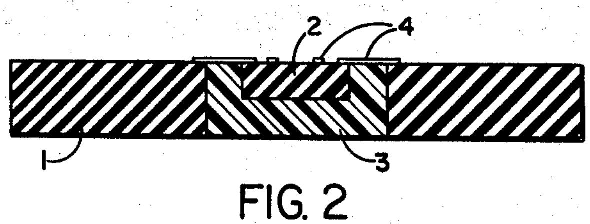
FIG. 2 is a sectional view of the chip mounting shown in a top view of FIG. 1.

FIG. 2 is a sectional view showing chip 2 mounted in circuit board 1 surrounded by resin 3. The deposited interconnections 4 are shown across the resin.

Figure 3:
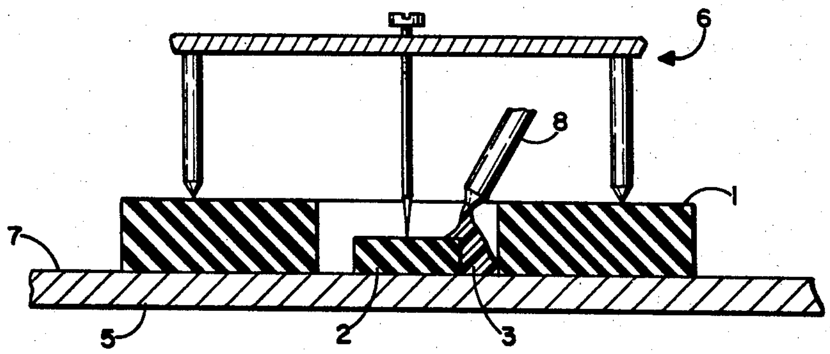
FIG. 3 is a sectional view through the middle of the inverted circuit board as it is held against a planar surface and the chip is cemented into place.

FIG. 3 shows the circuit board 1 inverted, with its conductive surface against a plate 5 having a Teflon coating 7. The chip 2 is held in place by positioning means 6 which also holds the circuit board 1 against the plate 5. Epoxy resin 3 is added through a tube 8 to surround the chip and fill the void. The epoxy is allowed to cure naturally or the process could be speeded by applying heat. After the resin has hardened, the assembly may be removed from contact with the plate and the conductors 4 may be evaporated or sprayed through a mask to interconnect the chip with the circuit board conductors. The entire assembly may then be coated with epoxy for protection.

In one implementation of the present invention an integrated circuit chip is mounted in a ceramic substrate. The chip is positioned by means of transparent tape across the face of the substrate over the hole. The void is filled from the back of the board with epoxy resin and, after the resin has cured, the tape is removed leaving the chip aligned with the upper surface of the substrate. Interconnections are then formed by evaporating aluminum through a mask using a common high-vacuum thin film deposition technique. Alignment of the chip is accomplished by viewing the chip and the connection points on the substrate through the deposition mask.

The method of the present invention is not limited to the connection of integrated circuit chips to circuit boards. It can be used as well for the mounting of various components including transistors, integrated circuits, resistors, capacitors, or other electronic microcircuitry. Likewise, the mounting method is not limited to use with circuit boards, but can also be used with thick or thin film substrates, lead frames, and the like.

Alignment of the components can be accomplished in numerous ways including: (1) an optically aligned template; (2) a cover plate or tape with location marks; and, (3) alignment of the edge of the component. Similarly, the component and circuit board may be held in position by a variety of ways.

The plate 5 in FIG. 3 is shown with a Teflon coating 7. It will be realized that the coating on the surface of the plate is not limited to Teflon. Any substance of the mold-release class may be used (the only requirement being that the plastic used to mount the chip must not adhere to it) to allow separation after the plastic cures.

It will be noted that the method of the present invention results in a minimal effect on the conducting paths due to temperature variations which cause expansion and contraction of the resin. The entire rear surface of the hole is open, allowing the effect of expansion and contraction to be felt along this surface rather than along the conductive surface.

Many variations and embodiments are possible within the spirit of this invention. It is, therefore, understood that the particular embodiments shown here are for illustration purposes only, and that the present invention is limited only by the scope of the appended claims.

I claim:

1. A method of mounting an electronic chip having connection points thereon in a sheet-like base material having a first surface for mounting electronic circuitry which comprises:

forming a perforation in said base material at least as large as said chip;

positioning said first surface of said base material against a planar surface of a material to which plastics will not adhere;

positioning said chip through said perforation against said planar surface whereby said connection points lie in the same plane as said first surface of said base material;

adding a hardening plastic to fill the void between said chip and the perimeter of said perforation; and removing the resulting assembly from contact with said planar surface.

2. The method of claim 1 wherein said material to which plastics will not adhere is Teflon.

3. The method of claim 1 wherein said plastic is an epoxy resin.

4. The method of claim 1 wherein said electronic chip is an integrated circuit chip.

5. The method of claim 1 including the additional steps of:

forming conducting paths between said connection points of said chip and points on said first surface of said base material by a depositing method; and coating the resulting assembly with epoxy.

6. The method of claim 5 wherein said depositing method includes depositing aluminum through a mask under high vacuum.

7. The method of claim 5 wherein said depositing method includes spraying a conductive material through a mask.

References Cited

UNITED STATES PATENTS

| | | | |
|---|---|---|---|
| 3,080,841 | 3/1963 | DeNobel. | |
| 3,234,440 | 2/1966 | Marinace. | |
| 3,387,360 | 6/1968 | Nakamura et al. | 29—579 |
| 3,439,235 | 4/1969 | Lanzl et al. | 29—588X |
| 3,461,549 | 8/1969 | Fujimoto | 29—577 |
| 3,469,148 | 9/1969 | Lund. | |
| 3,482,149 | 12/1969 | Duke | 29—588X |
| 2,890,395 | 6/1959 | Lathrop et al. | 317—234.3 |
| 3,290,756 | 12/1966 | Dreyer. | |

JOHN F. CAMPBELL, Primary Examiner

R. J. SHORE, Assistant Examiner

U.S. Cl. X.R.

29—589, 590, 591, 627